US006552563B1

(12) United States Patent
Yaniv et al.

(10) Patent No.: US 6,552,563 B1
(45) Date of Patent: Apr. 22, 2003

(54) DISPLAY PANEL TEST DEVICE

(75) Inventors: Zvi Yaniv, Bloomfield Hills, MI (US); Nalin Kumar, Austin, TX (US); Nathan Potter, Austin, TX (US)

(73) Assignee: SI Diamond Technology, Inc., Austin, TX (US)

( * ) Notice: Subject to any disclaimer, the term of this patent is extended or adjusted under 35 U.S.C. 154(b) by 1046 days.

(21) Appl. No.: 08/748,893

(22) Filed: Nov. 14, 1996

(51) Int. Cl.[7] .............................................. G01R 31/00

(52) U.S. Cl. ....................................... 324/770; 324/754

(58) Field of Search ................................ 324/757, 770, 324/754, 755; 361/749, 750, 751, 771, 767, 768; 174/254, 260, 267

(56) References Cited

U.S. PATENT DOCUMENTS 3,832,632 A * 8/1974 Ardezzone .................. 324/756
5,329,423 A 7/1994 Scholz ....................... 361/760
5,342,207 A 8/1994 Sobhani ....................... 439/74
5,378,982 A * 1/1995 Feigenbaum et al. ....... 324/770
5,415,555 A 5/1995 Sobhani ....................... 439/74
5,434,513 A 7/1995 Fujii et al. .................. 324/765
5,489,804 A 2/1996 Pasch ......................... 257/778
5,508,228 A 4/1996 Nolan et al. ................ 437/183
5,764,209 A * 6/1998 Hawthorne et al. ........... 345/87

* cited by examiner

*Primary Examiner*—Kamand Cuneo
*Assistant Examiner*—Russell M. Kobert
(74) *Attorney, Agent, or Firm*—Kelly K. Kordzik; Winstead Sechrest & Minick P.C.

(57) ABSTRACT

A device for testing flat panel displays includes an interface having compliant bumps mounted thereon, which make electrical contact with pads on the display panel. The interface may have a hole formed therein for allowing the passage of light therethrough when the interface is mounted on the display panel. The compliant bumps ensure that all of the bumps make sufficient electrical contact with the pads.

22 Claims, 3 Drawing Sheets

DISPLAY PANEL TEST DEVICE

TECHNICAL FIELD

The present invention relates in general to displays, and in particular, to a device for testing display panels.

BACKGROUND INFORMATION

Flat panel displays are a growth industry with projections for even greater growth into the next century. Such flat panel displays are and will be manufactured using various technologies, such as liquid crystal displays ("LCDs"), field emission displays ("FEDs"), plasma displays, displays using one or more of the aforementioned technologies, etc.

Regardless of the display technology utilized, there are typically numerous electrical contact pads located around the periphery of the display panel in order to provide an electrical path to each of the various pixel locations within the display panel. For example, in a matrix-addressable display panel, there will be several rows and columns of intersecting electrical pathways for selectively addressing the individual pixels within the display panel. Each of these rows and columns are accessible externally by corresponding pad locations. An example of such pads is illustrated in FIG. 4, and further described in U.S. Pat. No. 5,449,970, which is hereby incorporated by reference herein, which shows panel 101 with pixels 420 (not shown in detail) addressed via pads 202.

During various manufacturing stages, and upon completion of the manufacturing of the display panel, various tests of the display panel are often desired to ensure the quality of the manufacturing process and the resulting end quality of the display panel. To perform such tests, there needs to be some type of interface for coupling the individual pads on the display panel to test circuitry. As a result, there is a need in the art for an improved test interface for testing of flat panel display panels.

SUMMARY OF THE INVENTION

The foregoing need is satisfied by the present invention, which includes an interface having electrical paths adaptable for coupling to display test circuitry, wherein the interface includes one or more compliant bumps mounted on the interface and connected to the electrical paths, wherein the compliant bumps are adaptable for making contact with the pads on the display panel.

The interface may be constructed of a printed circuit board ("PCB") having electrical paths embedded thereon making contact with each one of the compliant bumps. Furthermore, the interface may have mounted thereon driver circuitry for driving the individual pixels of the display panel. The driver circuitry may be coupled to a test device controller or a computer by a ribbon cable.

The interface may also be in the form of a ring having a hole formed therein so that when the interface is mounted on the display panel, light emitted from the display panel can pass through the hole and be observed.

An advantage in incorporating compliant bumps is that sufficient electrical connection is made between each one of the pads and the compliant bumps by using pressure to adjoin the interface and the display panel despite the fact that such sufficient electrical connection may not exist at one or more interface locations between the bumps and the pads during initial contact between the interface and the display panel.

Another advantage of the present invention is that the compliant polymer that forms part of the compliant bump provides a mechanism that compensates for warp or non-planarities in the PCB substrate as well as for pad height non-uniformities. Better bump height uniformity may be achieved using the present invention than is possible with conventional techniques that electroplate solid metal bumps.

Compliant bumps also respond compliantly over a larger range of displacements than do metals. These factors allow bonding forces to be lower than with solid metal bumps. This is because there is no need for the excessive bonding forces used to plastically deform metal bumps to correct for bump non-uniformities. The present invention, accordingly permits use of a wider range of bonding perimeters while ensuring electrical conductivity between the testing interface and the display panel.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION

Figure 1:
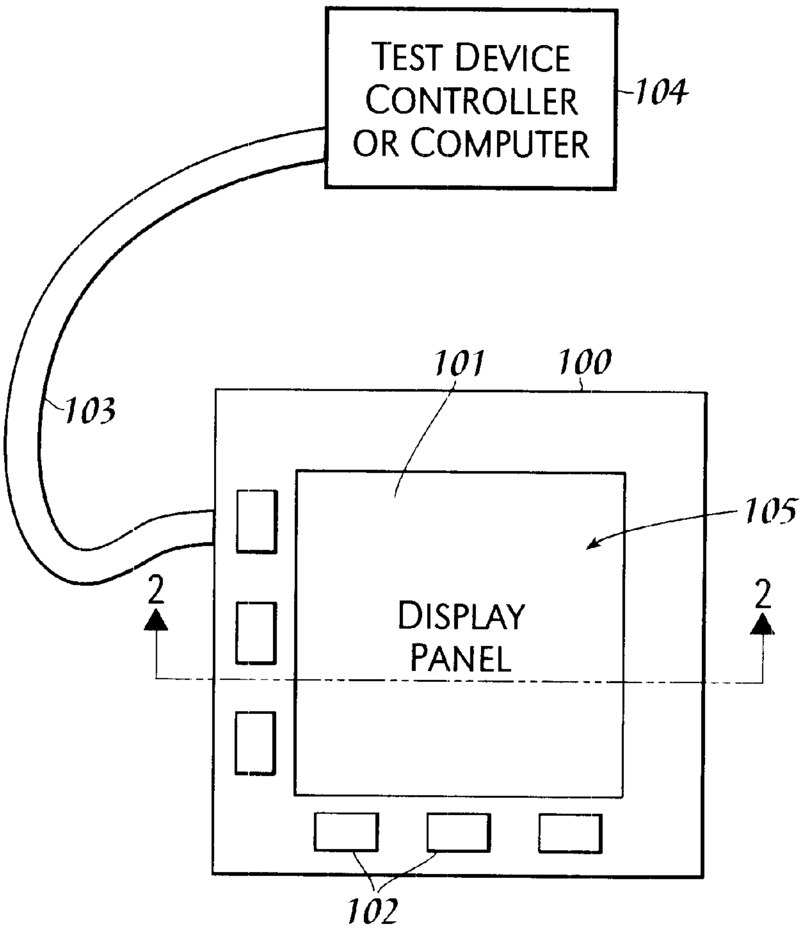
FIG. 1 illustrates an apparatus for testing a display panel in accordance with the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring to FIG. 1, there is illustrated a top view of interface 100 mounted on display panel 105 for testing. As noted above, display panel 105 may be in one of various stages of manufacture. Light emitted from display panel 105 may be observed through hole 105 within interface 100.

Interface 100 may be comprised of a PCB or other equivalent material. Shown are several driver chips 102 mounted on two sides of interface 100. Optionally, driver chips 102 may be mounted along the entire periphery of interface 100, especially in the instance when pads (not shown) on display panel 105 are located along the entire periphery of display panel 101. Coupling of driver chips 102 to a test device controller or computer 104 is done by ribbon cable 103 or an equivalent structure. One skilled in the art will be able to make the individual connections between ribbon cable 103 and driver chips 102.

The driver chips provide for in-line functional testing of a display using essentially the same electronic circuitry that will be used to drive the display during use. Furthermore, chips 102 may include circuitry for testing other aspects of the display during any stage of manufacturing of the display. For example, testing of the lines (which may be aluminum) may be performed to determine if the circuit lines to the display matrix are good. Additionally, chips 102 may include circuitry for measuring the resistance of the lines.

Figure 3:
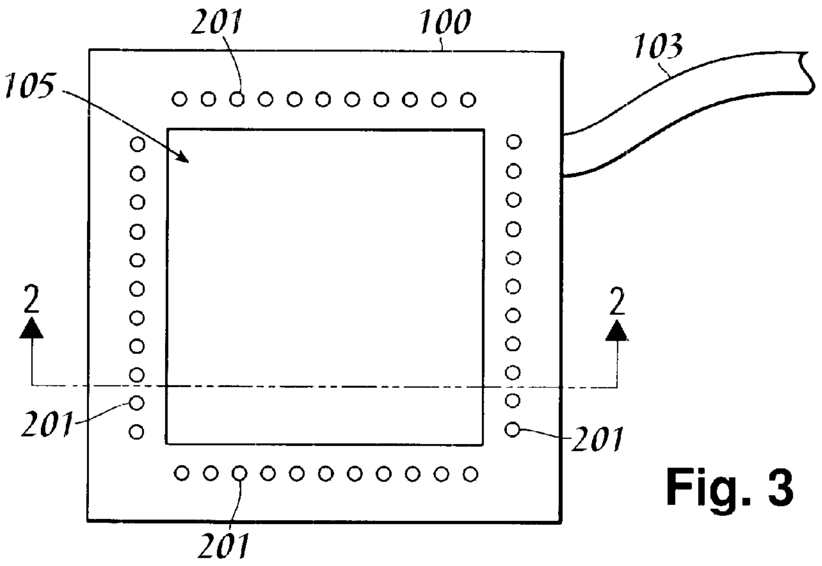
FIG. 3 illustrates a bottom view of the interface of the present invention showing the compliant bumps.
Figure 4:
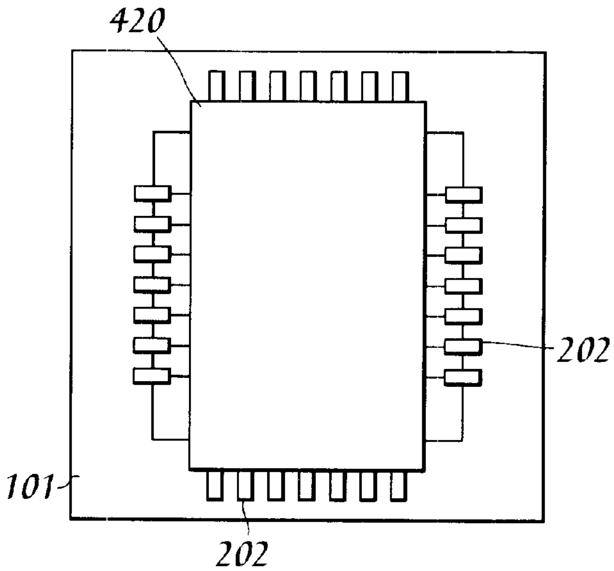
FIG. 4 illustrates a display panel to be tested.

Referring next to FIG. 3, there is illustrated the underside of interface 100 showing individual compliant bumps 201 located along the periphery of interface 100. Shown are compliant bumps 201 located on all four sides of interface 100. However, in an instance where pads on the display panels are located on only two sides, interface 100 may only include compliant bumps 201 on two corresponding sides of interface 100.

Note, interface 100 is shown in the form of a square with a hole 105 formed therein, but may comprise any shape, as long as compliant bumps 201 are located thereon so as to match the structure of the pads located on the display panel 101.

Figure 2:
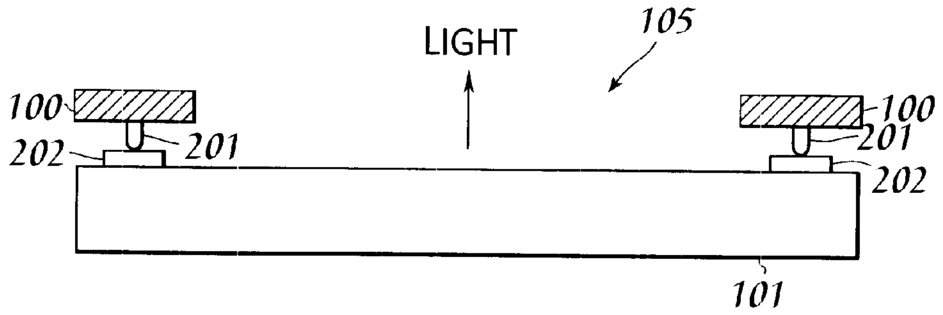
FIG. 2 illustrates a cross-sectional view of the interface in accordance with the present invention.

Referring next to FIG. 2, there is illustrated a cross-sectional view of interface 100. Display panel 101, has pads 202 located thereon for accessing individual pixels (not shown) within display panel 101. When interface 100 is mounted onto display panel 101, compliant bumps 201 make contact with pads 202 so that there is an electrical connection therebetween for running the various test operations.

Figure 5:
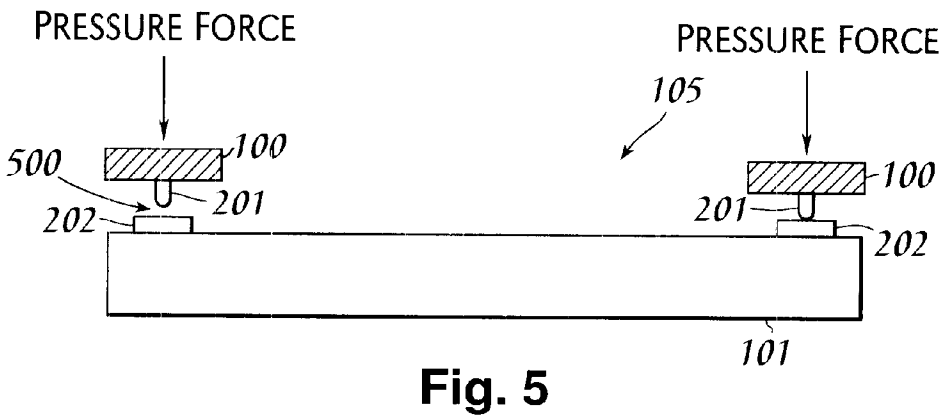
FIG. 5 illustrates mounting of the present invention on the display panel where during initial contact not every bump is making sufficient contact with the pads of the display panel.

Referring next to FIG. 5, there is illustrated an instance in time wherein interface 100 is making initial contact with display panel 101. At this instance in time, there is gap 500 between one or more of compliant bumps 201 and pads 202 while other compliant bumps 201 are making sufficient contact with corresponding pads 202. This may occur due to imperfections within the manufacture of interface 100 so that it is not completely planar, or in the manufacture of compliant bumps 201 and/or in the manufacture of pads 202 so that they do not have coplanar contact surfaces relative to each other.

Display panel 101 may comprise any display technology, such as FED or LCD. As shown, in order to ensure that all compliant bumps 201 make sufficient electrical contact with pads 202, a pressure force may be applied onto interface 100 into display panel 101. As discussed within U.S. Pat. No. 5,508,228, which is hereby incorporated by reference herein, compliant bumps 201 permit such a pressing force to be performed with little or no stressing of interface 100 or display panel 101, since the compliant bumps 201 already in contact with pads 202 may be compressed slightly so that other compliant bumps 201 are able to eventually make contact with pads 202, as shown in FIG. 2.

Figure 6:
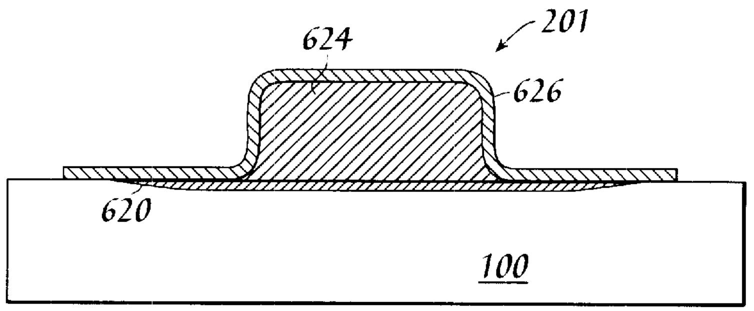
FIG. 6 illustrates further detail of a compliant bump.

Referring next to FIG. 6, there is illustrated further detail of compliant bump 201 in a cross-sectional view. On interface 100 is wire bond pad 620. Wire bond pad 620 is a portion of the electrical pads coupling compliant bumps 201 to driver chips 102. Polymer bump 624 attaches to wire bond pad 620. Gold metalization layer 626 covers both polymer bump 624 and may cover at least a portion of bond pad 620. For a further discussion of compliant bumps, please refer to U.S. Pat. No. 5,508,228, which also discusses the advantages of using compliant bump technology.

Figure 7:
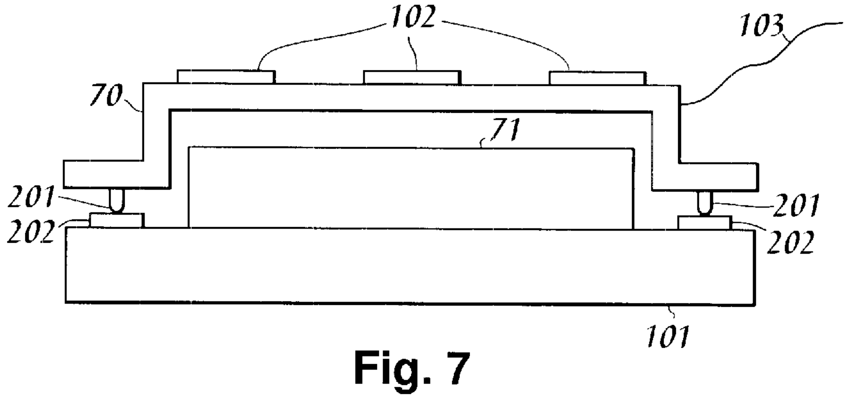
FIG. 7 illustrates an alternative embodiment of the present invention.

Referring next to FIG. 7, there is illustrated an alternative embodiment of the present invention which shows the display at an advanced stage during the manufacturing process where color filter 71 has been mounted onto display panel 101. Interface 100 has been modified to be interface 70 which is physically able to mount over color filter 71 in order to perform the testing process as described above.

An advantage of using compliant bump technology with such a testing device is that the testing interface has a longer lifetime because of the ease of stress brought about by the compressibility of the compliant bumps. Furthermore, the sometimes delicate nature of flat panel displays is also protected by the use of the compliant bumps on the interface.

Figure 8:
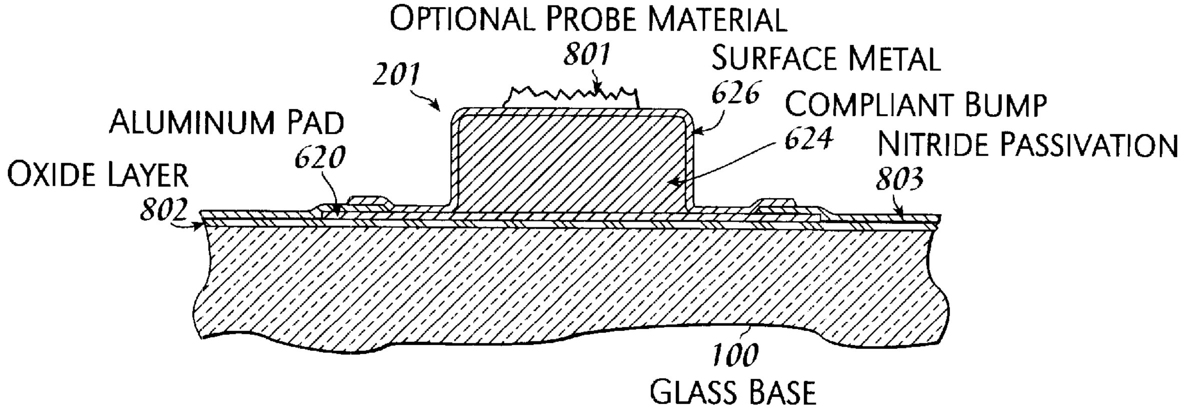
FIG. 8 illustrates addition of an optional probing material to a compliant bump.

Referring next to FIG. 8, there is illustrated an alternative embodiment of the present invention where compliant bump 201 is modified to add a thin film of a sharp probing material, which aids in making a low resistive contact with pads 202 by "breaking through" any oxide layer for example. The probing material may comprise a diamond grit mixed with a conductive epoxy or a metal paste deposited on the surface of compliant bump using well-known techniques. FIG. 8 also shows an oxide layer 802 and nitride passivation 803.

Although the present invention and its advantages have been described in detail, it should be understood that various changes, substitutions and alterations can be made herein without departing from the spirit and scope of the invention as defined by the appended claims.

What is claimed is:

1. An apparatus adaptable for testing an electric device comprising:

an interface having electrical paths adaptable for coupling to display test circuitry; and one or more compliant bumps mounted on said interface and connected to said electrical paths, wherein said one or more compliant bumps are adaptable for making contact with pads on said electric device wherein said electric device is a display panel.

2. The apparatus as recited in claim 1 wherein said display test circuitry includes driver electronics mounted on a PCB and coupled to said electrical paths.

3. The apparatus as recited in claim 1 wherein said interface has a ring structure forming a hole in said interface to permit passage of light through said hole when said interface is coupled to said display panel.

4. The apparatus as recited in claim 1 wherein said one or more compliant bumps are located to be adaptable for interfacing with said pads on two sides of display panel.

5. The apparatus as recited in claim 1 wherein said one or more compliant bumps are located to be adaptable for interfacing with said pads on four sides of said display panel.

6. The apparatus as recited in claim 1, wherein the one or more compliant bumps are compressible.

7. A method for testing a display panel at various stages of manufacture comprising the steps of:

providing an interface having compliant bumps mounted thereon and electrical paths connected to said compliant bumps;

providing test circuitry operable for performing one or more test operations on said display panel, wherein said test circuitry is connected to said electrical paths;

mounting said interface onto said display panel so that said compliant bumps make contact with pads on said display panel, wherein said pads are electrically connected to pixel locations on said display panel.

8. The method as recited in claim 7, further comprising the step of:

pressing said interface toward said display panel so that all of said compliant bumps make contact with said pads, wherein said pressing step compresses one or more of said compliant bumps.

9. The method as recited in claim 7, wherein said display panel is in an intermediate stage of being manufactured.

10. The method as recited in claim 7, wherein said interface is a PCB.

11. The method as recited in claim 10, wherein said test circuitry includes driver electronics mounted on said PCB and coupled to said electrical paths.

12. The method as recited in claim 7, wherein one or more of said compliant bumps include a film of probing material.

13. The method as recited in claim 12, wherein said probing material includes a diamond grit.

14. The method as recited in claim 7, wherein the compliant bumps are compressible.

15. An apparatus adaptable for testing a display panel comprising:

an interface having electrical paths adaptable for coupling to display test circuitry; and one or more compliant bumps mounted on said interface and connected to said electrical paths, wherein said one or more compliant bumps are adaptable for making contact with pads on said display panel.

16. The apparatus as recited in claim 15, wherein said interface is a PCB.

17. The apparatus as recited in claim 16, wherein said display test circuitry includes driver electronics mounted on said PCB and coupled to said electrical paths.

18. The apparatus as recited in claim 15, wherein said interface has a ring structure forming a hole in said interface to permit passage of light through said hole when said interface is coupled to said display panel.

19. The apparatus as recited in claim 15, wherein said one or more compliant bumps are located to be adaptable for interfacing with said pads on two sides of said display panel.

20. The apparatus as recited in claim 15, wherein one or more of said compliant bumps include a film of probing material.

21. The apparatus as recited in claim 20, wherein said probing material includes a diamond grit.

22. The apparatus as recited in claim 15, wherein the one or more compliant bumps are compressible.

* * * * *